(12) United States Patent
Min et al.

(10) Patent No.: US 7,075,812 B2
(45) Date of Patent: Jul. 11, 2006

(54) FERROELECTRIC RANDOM ACCESS MEMORY DEVICE AND CONTROL METHOD THEREOF

(75) Inventors: Byung-Jun Min, Yongin-si (KR); Byung-Gil Jeon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 2 days.

(21) Appl. No.: 11/053,649

(22) Filed: Feb. 8, 2005

(65) Prior Publication Data
US 2005/0174831 A1    Aug. 11, 2005

(30) Foreign Application Priority Data
Feb. 10, 2004    (KR) ...................... 10-2004-0008600

(51) Int. Cl.
*G11C 11/22* (2006.01)
(52) U.S. Cl. ............... 365/145; 365/230.06; 365/233.5
(58) Field of Classification Search ................ 365/145, 365/230.06, 189.05, 230.08, 233.5
See application file for complete search history.

(56) References Cited

U.S. PATENT DOCUMENTS

| | | | |
|---|---|---|---|
| 5,650,978 A | | 7/1997 | Ukita et al. |
| 5,907,861 A | * | 5/1999 | Seyyedy ...................... 711/152 |
| 6,242,940 B1 | | 6/2001 | Na |
| 6,967,860 B1 | * | 11/2005 | Choi et al. ................... 365/145 |

* cited by examiner

*Primary Examiner*—Anh Phung
*Assistant Examiner*—Dang T Nguyen
(74) *Attorney, Agent, or Firm*—F.Chau & Associates,LLC (57) ABSTRACT

There are provided a ferroelectric RAM (Random Access Memory) device and a control method thereof. In the device, a data input buffer circuit senses a transition of input data and generates a data transition detection signal. Further, a plate pulse generator generates a single pulse to store first logic data among applied data at an enable section of a plate line, and to store second logic data opposite to the first logic data at a disable section of the plate line, where the single pulse enables the plate line connected to a memory cell in response to the data transition detection signal and then disables it after lapse of a given time. Thus, a stabilized write operation can be provided and a control of the ferroelectric RAM device can be simplified.

21 Claims, 12 Drawing Sheets

FERROELECTRIC RANDOM ACCESS MEMORY DEVICE AND CONTROL METHOD THEREOF

CROSS-REFERENCE TO RELATED APPLICATION

This application claims the priority of Korean Patent Application NO. 10-2004-0008600, filed on Feb. 10, 2004, in the Korean Intellectual Property Office, the disclosure of which is incorporated by reference herein in its entirety.

BACKGROUND

1. Technical Field

The present invention relates to semiconductor memory devices, and more particularly, to a ferroelectric random access memory device and a control method thereof, to provide a stabilized write operation.

2. Discussion of the Related Art

To overcome the refresh limit necessary for a large capacity DRAM (Dynamic Random Access Memory), a ferroelectric thin layer is applied to a dielectric layer of a capacitor. A ferroelectric Random Access Memory (FRAM), using such a ferroelectric thin layer, is a kind of nonvolatile memory device that has the advantage of remembering storage information even when there is a power loss, operates at a high-speed and at reduced power consumption reduction. Such a ferroelectric memory is expected to be used as a main memory device or a record medium to record sound or image, in various electronic instruments and equipments having file storage and detection functions such as portable computer, cellular phone and game machines etc.

In such a ferroelectric RAM device, a memory cell is constructed of a ferroelectric capacitor and an access transistor, which store logic data '1' or '0' in conformity with an electric polarization state of a ferroelectric capacitor.

Figure 1:
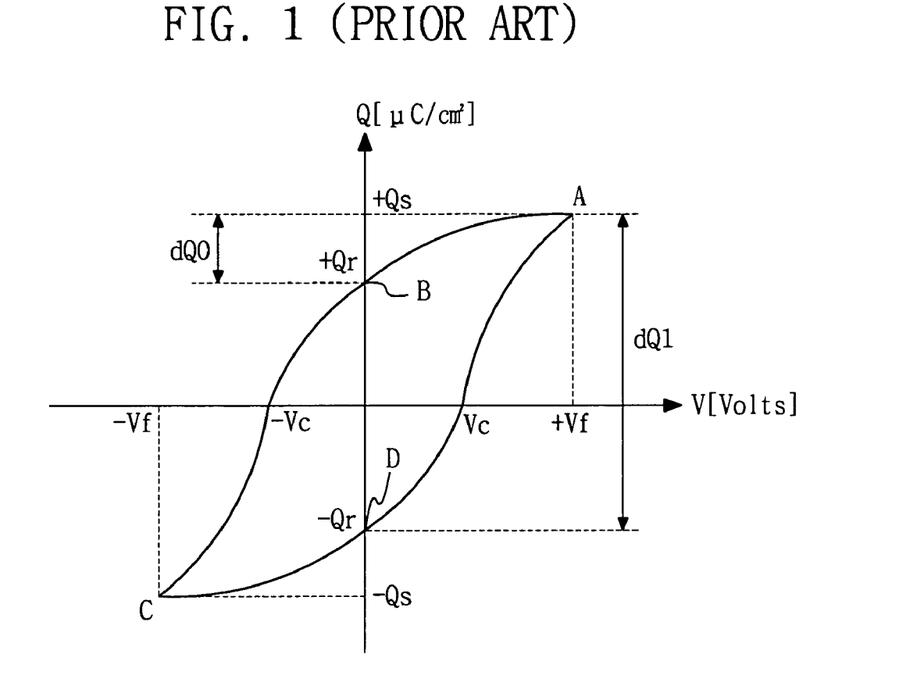
FIG. 1 is a graph that illustrates a hysteresis curve of general ferroelectric material.

FIG. 1 illustrates a general hysteresis curve for ferroelectric material constituting a ferroelectric memory cell. The curve assumes that between the two electrodes of the ferroelectric capacitor a voltage is applied to the ferroelectric material, wherein the electrode of the capacitor connected to a plate line is the positive electrode, and the other, the negative electrode; in the hysteresis curve the X axis indicates the voltage applied to both ends of the capacitor, and the Y axis indicates the quantity of charge excited to the surface by a spontaneous polarization of the ferroelectric material, that is, a polarization ($\mu C/cm^2$).

Referring to FIG. 1, if a ground voltage Vss or 0V is applied and no electric field is applied to the ferroelectric material, a polarization is not generated. When the voltage across both ends of the ferroelectric capacitor increases in a plus direction, a polarization or charge quantity increases from zero to a state point A within the positive polarization region. At the state point A a polarization is generated to one direction, and a polarization of the state point A becomes a maximum value. At this time, a polarization, namely a charge quantity, is kept in the ferroelectric material, and is marked as +Qs. After that, even if the voltage across both ends of the capacitor falls to the ground voltage Vss, the polarization is not lowered to zero but remains at a state point B. For this residual polarization, the charge volume kept in the ferroelectric material is represented as +Qr. Next, if the voltage across both ends of the capacitor increases in a minus direction, the polarization is changed from a state point B to a state point C, within the negative charge polarization region. At the state point C, ferroelectric material is polarized to a direction opposite to the polarization direction of the state point A. This polarization is represented as −Qs. Then, even if the voltage across both ends of the capacitor again falls to a ground voltage Vss, the polarization does not fall to zero but remains at a state point D. This residual polarization is represented as −Qr. When the voltage applied across both ends of the capacitor again increases to a plus direction, the polarization of the ferroelectric material is changed from the state point D to the state point A.

As above, if a voltage for generating an electric field is applied once to a ferroelectric capacitor, where ferroelectric material is inserted between the two electrodes, a polarization direction based on spontaneous polarization is maintained even if the electrodes are in a floating state. The surface charge of ferroelectric material, through the spontaneous polarization, is not naturally lost by leakage etc. If a voltage is not applied in an opposite direction so that a polarization becomes zero, the polarization direction is maintained intact.

When a voltage is applied in a plus direction to the ferroelectric capacitor and is then removed, The residual polarization of the ferroelectric material constituting the ferroelectric capacitor becomes a +Qr state. When a voltage is applied in a minus direction to the ferroelectric capacitor and is then removed, the residual polarization of the ferroelectric material becomes a −Qr state. Here, if assuming that a logic state at the +Qr state of residual polarization indicates data '0', the logic state at the −Qr state of residual polarization indicates data '1'.

Figure 2:
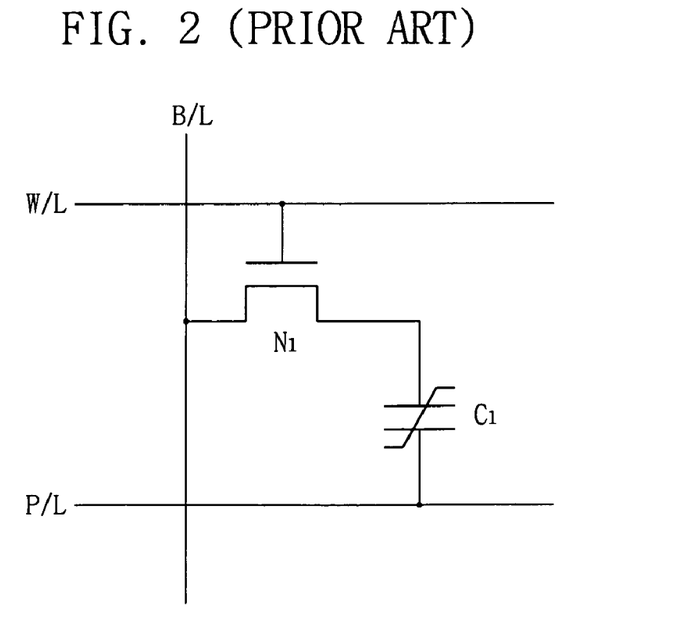
FIG. 2 is a schematic diagram of a memory cell constituting a conventional ferroelectric memory cell array.

FIG. 2 illustrates memory cells constituting a memory cell array of a conventional ferroelectric RAM device. A memory cell is constructed from one access transistor N1 and one ferroelectric capacitor C1. The access transistor N1 includes two terminals, a source and a drain, connected between one electrode of the ferroelectric capacitor C1 and a bit line B/L. The gate of the access transistor N1 is connected to a word line W/L. Another electrode of the ferroelectric capacitor C1 is connected to a plate line P/L.

A plurality of memory cells is arranged into rows and columns, constituting a cell array. Read and write operations in such a ferroelectric RAM device are performed by controlling pulses that are applied to the ferroelectric memory cell.

To guarantee a stabilized write operation in such a ferroelectric RAM device, the time to write respective data should be ensured. Thus, a section to write data '0' and a section to write data '1' are each determined to exist separately within one cycle. Mainly, the section to write data '0' is first determined and then the section to write data '1' is determined. Particularly, in a ferroelectric RAM device having an asynchronous operation, one cycle operation is controlled by an address transition detection (ATD) signal, so as to perform a write operation.

Figure 3:
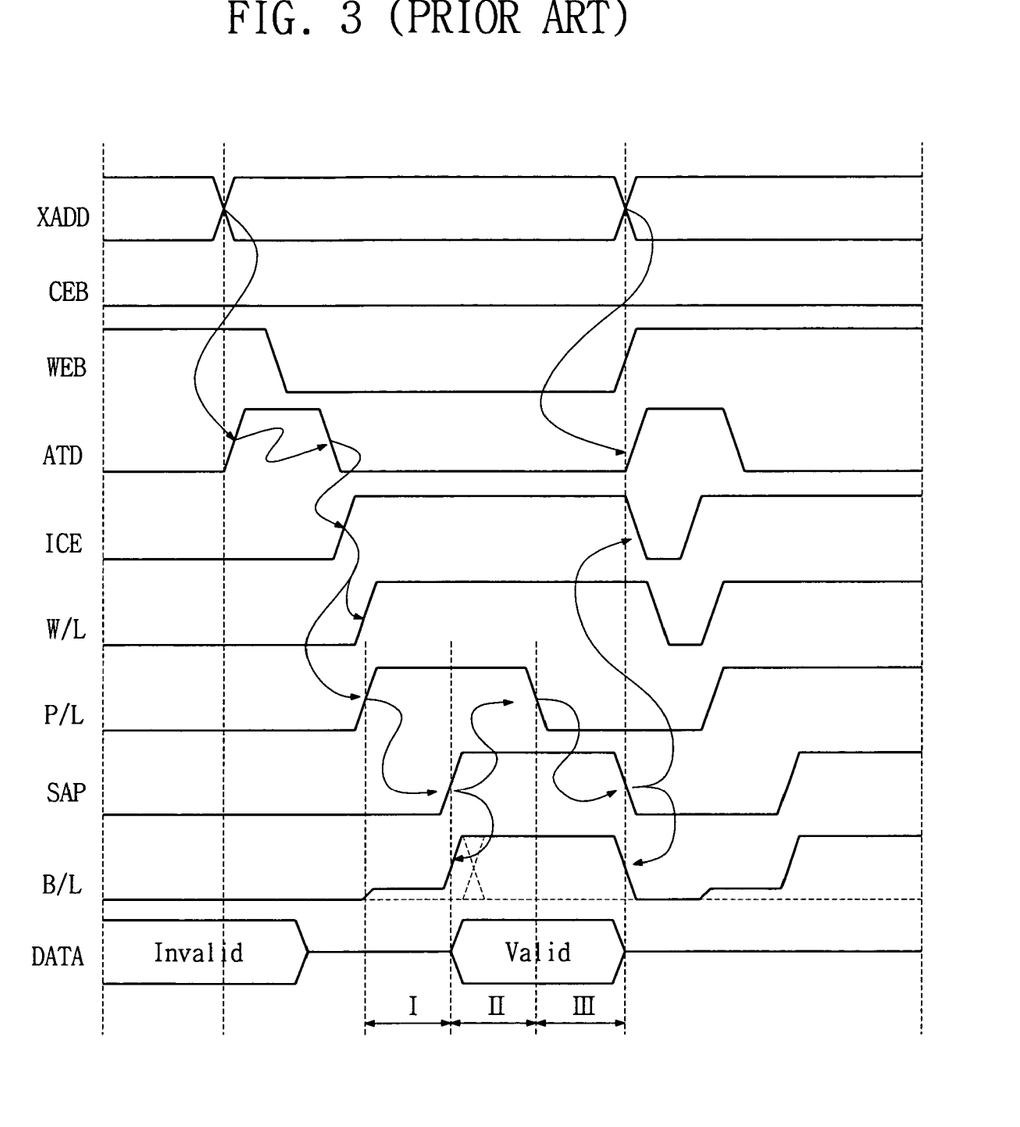
FIG. 3 is a timing diagram for write operations in a conventional ferroelectric RAM device.

FIG. 3 illustrates a timing diagram for the operation of a ferroelectric RAM device according to the prior art. Here an external chip enable signal CEB maintains a low level when in an enable state, and in this state an address signal XADD is applied from the outside. A transition of the address signal is sensed, generating the address transition detection signal ATD, and an internal chip enable signal ICE is generated by the address transition detection signal ATD. When the ICE is generated, a word line W/L is enabled by a word line decoder and driver circuit. Also, a plate line P/L is enabled in response to the ICE. When the plate line P/L is enabled, a read section I starts on operation. A voltage corresponding to data stored in a memory cell is excited to a bit line B/L maintaining a ground voltage state. Next, a sense amplifier enable signal SAP is generated, in response to the enable signal of the plate line, to enable a sense amplifier. When the sense amplifier is enabled, the read section I is completed. The next section is write section II for writing data '0'. In this section when the data signal DATA is later inputted from the outside, the signal DATA is excited to the bit line B/L. If the data excited to the bit line B/L is '0', the voltage of the bit line maintains a ground voltage state. Thus, data '0' is written by a voltage difference between plate line P/L (having an enable state) and the bit line B/L (having a ground voltage state). Meanwhile, if the data excited to the bit line B/L is '1', the voltage of the bit line maintains a power source voltage state; thus, since there is no voltage difference between the plate line P/L (having an enabled state) and the bit line B/L, nothing is generated. The write operation of the data '0' is performed before the plate line P/L is disabled, which occurs after the generation of the sense amplifier enable signal once a given time has lapsed. The subsequent section, between the plate line P/L being disabled and the sense amplifier being disabled, is provided as a write section III for writing data '1'. In this section when the voltage of the bit line B/L has a power source voltage level, by virtue of the voltage corresponding to data '1' excited to the bit line B/L, and the plate line P/L maintains a disable sate the data '1' is stored at a memory cell by the voltage difference between the bit line B/L and the plate line P/L. When the write operation is completed, the bit line B/L is precharged and the signal ICE is disabled.

In the conventional ferroelectric RAM device when performing such a write operation, a plate line P/L is enabled and after a lapse of time corresponding to the read section I, a sense amplifier is enabled. After the enabling of the sense amplifier, time lapses corresponding to the write section II for writing data '0', and then the plate line P/L is disabled. After the disabling of the plate line P/L, time corresponding to the write section III for writing data '1' lapses and then the sense amplifier is disabled.

In the conventional ferroelectric RAM device, read and write cycle time is mainly decided by these sections. When the respective sections become equal to one another by a given time, there are advantages of reducing a cycle time and having the same cycle time, thereby simplifying a control operation of ferroelectric memory. However, data to be written in a memory cell should be inputted within the write section II of data '0' at least. If the data is inputted later or if there is not enough time for writing data, even if inputted within the write section II of the data '0', a failure will occur since the data cannot be stored in the memory cell.

Figure 4:
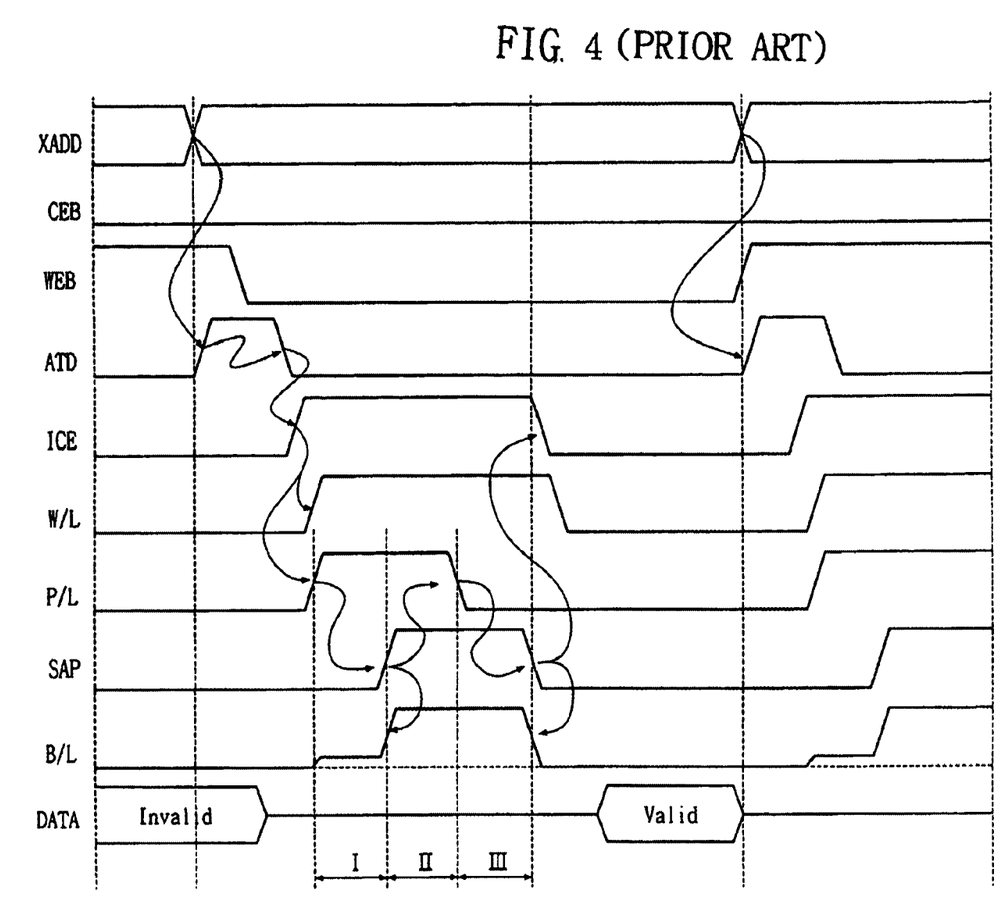
FIG. 4 is a timing diagram for write operations in a conventional ferroelectric RAM device having a long cycle.

FIG. 4 is a timing diagram illustrating write operations in a ferroelectric RAM device having a long cycle according to the prior art, where the operation of the ferroelectric RAM device is similar to FIG. 3. However, in the case of a write operation during the long cycle, the probability of a failure occurring is higher than that of the ferroelectric RAM device having a short cycle similar to FIG. 3. For example, data may be inputted after the write section II for writing data '0' or after the write section III for writing data '1'. In this case, the inputted data cannot be written or undesired data is written in the memory cell, causing a failure.

Figure 5:
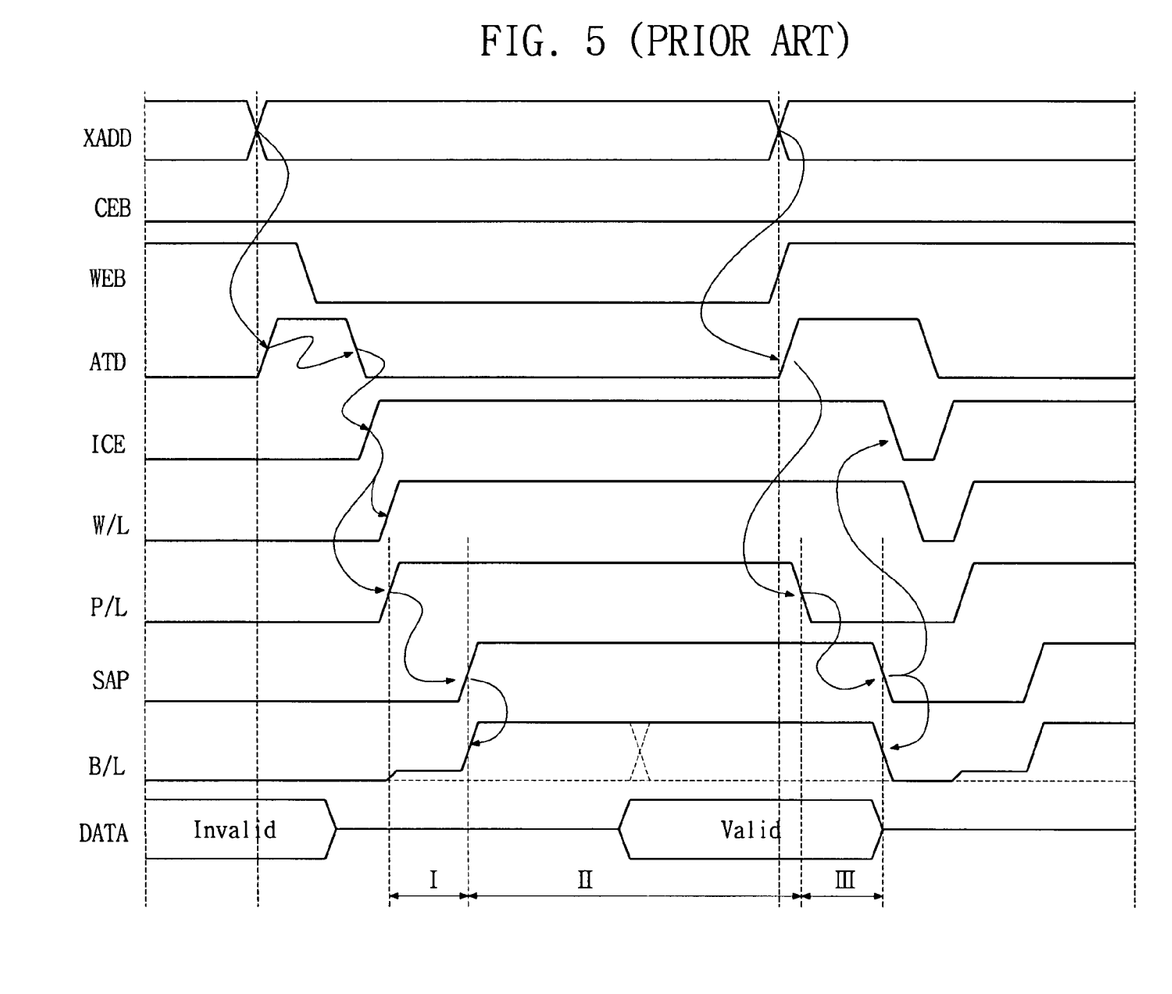
FIG. 5 is a timing diagram for write operations in a conventional ferroelectric RAM device provided to overcome problems depicted in FIG. 4.
Figure 6:
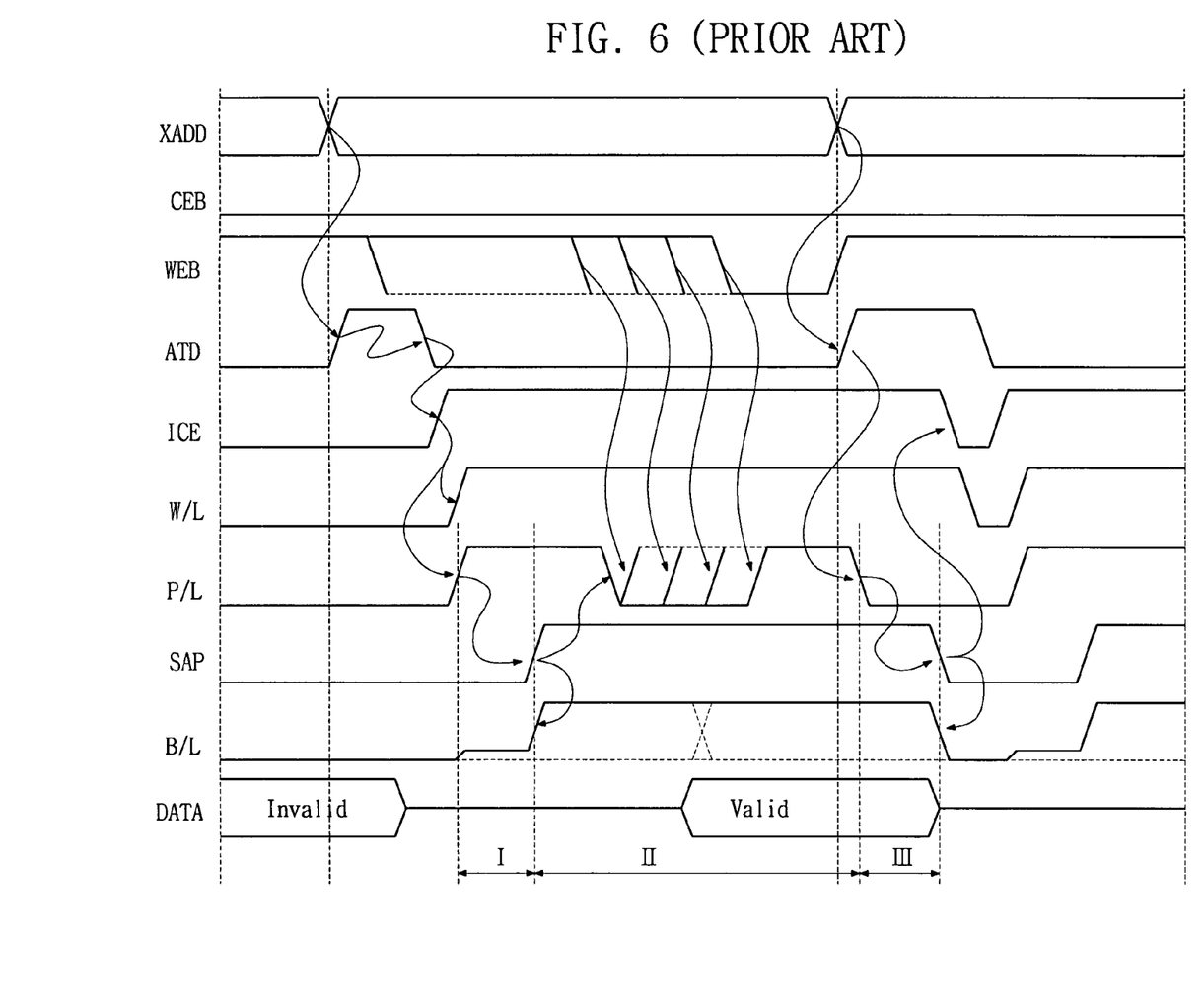
FIG. 6 is a timing diagram for write operations in a conventional ferroelectric RAM device provided to overcome problems depicted in FIG. 4.

FIGS. 5 and 6 are timing diagrams illustrating write operations in a conventional ferroelectric RAM device attempting to overcome problems depicted in FIG. 4.

FIG. 5 depicts a timing diagram illustrating the operation of a conventional ferroelectric RAM device to ensure a write section by disabling a plate line P/L in response to an address transition detections signal ATD of the next cycle. The read section I, in which the plate line P/L is enabled and the sense amplifier is enabled, is the same or similar to the operation depicted in FIG. 4. Meanwhile, the write section II for writing data '0' starts on an operation when the sense amplifier is enabled, and becomes continuous till the plate line P/L is disabled by the ATD generated by sensing the address signal of the next cycle, instead of disabling the plate line P/L after the sense amplifier is enabled and then a given time lapses. Within this write section II of the data '0', the write section of the actual data '0' is a section that starts from the time of a data input to the disabling time of the plate line. The lapse of time occurring after the disabling of the plate line P/L corresponds to the write section III of data '1', after which the sense amplifier is disabled, and the write section III of the data '1' exists within the next cycle.

FIG. 6 is a timing diagram for operations of a conventional ferroelectric RAM device to ensure a write section by independently enabling a plate line P/L through use of a write enable signal WEB. The read section I, in which the plate line P/L is enabled and the sense amplifier is enabled, is equivalent to the operation of FIG. 4. That is, after the plate line P/L is enabled and the time corresponding to the read section I lapses, a sense amplifier is enabled. After the enabling of the sense amplifier and the subsequent lapse of a given time, the plate line P/L is disabled. At this section, the plate line P/L is again enabled independently by an applied write enable signal WEB, regardless of the state, disabled or enabled, of the plate line P/L. The plate line P/L consecutively maintains an enable state till the plate line P/L is disabled by an address transition detection signal ATD, generated by sensing the address signal of the next cycle. Thus, the section where the sense amplifier is enabled and then the plate line P/L is disabled by the address transition detection signal, becomes the write section II of data '0'. Within this write section II of the data '0', a write operation of the actual data '0' is performed from the time when the data signal DATA is applied. After the disabling of the plate line P/L and a subsequent lapse of time corresponding to the write section III of data '1', the sense amplifier is disabled, and the write section III of the data '1' exists within a next cycle.

In the ferroelectric RAM devices shown in FIGS. 5 and 6, the enable section of plate line is prolonged, thus the write section II of the data '0' can be prolonged as well. This provides a stabilized write operation of data '0' even if an input of data comes late. In this system, however, the write section of data '1' is pushed into the next cycle by as much as the write section of data '0' is prolonged, thus the write cycle time increases and cycle times of read operation and write operation become different. The write section of data '1' exists in the next cycle, thus also increasing the read or write operation cycle the next applied address signal. In controlling such a ferroelectric RAM device mutually different cycle times should be applied in conformity with a cycle and cycle configuration, thus a control of the ferroelectric RAM device becomes complicated. In this case the longest cycle is equally applied to all cycle times to solve such a control complication, thus there is a disadvantage in the speed aspect of the device.

SUMMARY OF THE INVENTION

Embodiments of the present invention provide a ferroelectric Random Access Memory (RAM) device and a control method thereof, which is capable of performing a stabilized write operation. Here, read and write cycle times are equal to each other, thereby simplifying a control operation of the ferroelectric RAM device. Further, all write operations are performed in one cycle time so as to reduce write cycle time.

An aspect of the present invention provides a ferroelectric RAM device for performing a write operation of storing data at a ferroelectric memory cell that is constructed of a ferroelectric capacitor and an access transistor. The ferroelectric RAM device includes a data input buffer circuit for sensing a transition of input data and generating a data transition detection signal; and a plate pulse generator for generating a pulse that enables a plate line connected to a memory cell in response to the data transition detection signal and then disables it after lapse of a given time, and for storing first logic data among applied data at an enable section of the plate line, and storing second logic data opposite to the first logic data at a disable section of the plate line.

The pulse generated by the data transition detection signal on the plate line is generated independently regardless of whether the plate line is enabled or disabled, and the enable section of the plate line may be a section having time enough to store data at the memory cell. Further, the first logic data may be data '0' and the second logic data may be data '1'.

Another aspect of the present invention provides a control method of a ferroelectric RAM device for performing a write operation of storing data at a ferroelectric memory cell that is constructed of a ferroelectric capacitor and an access transistor. The method includes generating a data transition detection signal by sensing a transition of data inputted from the outside after an address signal is applied. It also includes generating a plate line enable signal in response to the data transition detection signal and enabling a plate line connected to the memory cell. Storing a first logic data among input data at the memory cell, at an enable section of the plate line. Disabling the plate line. Storing a second logic data opposite to the first logic data, among input data, at the memory cell, at a disable section of the plate line.

The method may further include generating an enable signal on the plate line in response to an address transition detection signal that is outputted by sensing a transition of the address signal, before the plate line is enabled in response to the data transition detection signal. It may further include enabling the plate line in response to a write enable signal applied from the outside.

The systematic and methodic configuration according to exemplary embodiments of the present invention provides a stabilized write operation and simplifies a control operation of ferroelectric RAM device. Further, a write operation is completed in one cycle time, thereby reducing a write cycle time.

BRIEF DESCRIPTION OF THE DRAWINGS

Exemplary embodiments of the invention are described with reference to the accompanying drawings, of which.

DETAILED DESCRIPTION OF THE PREFERRED EMBODIMENTS

Figure 7:
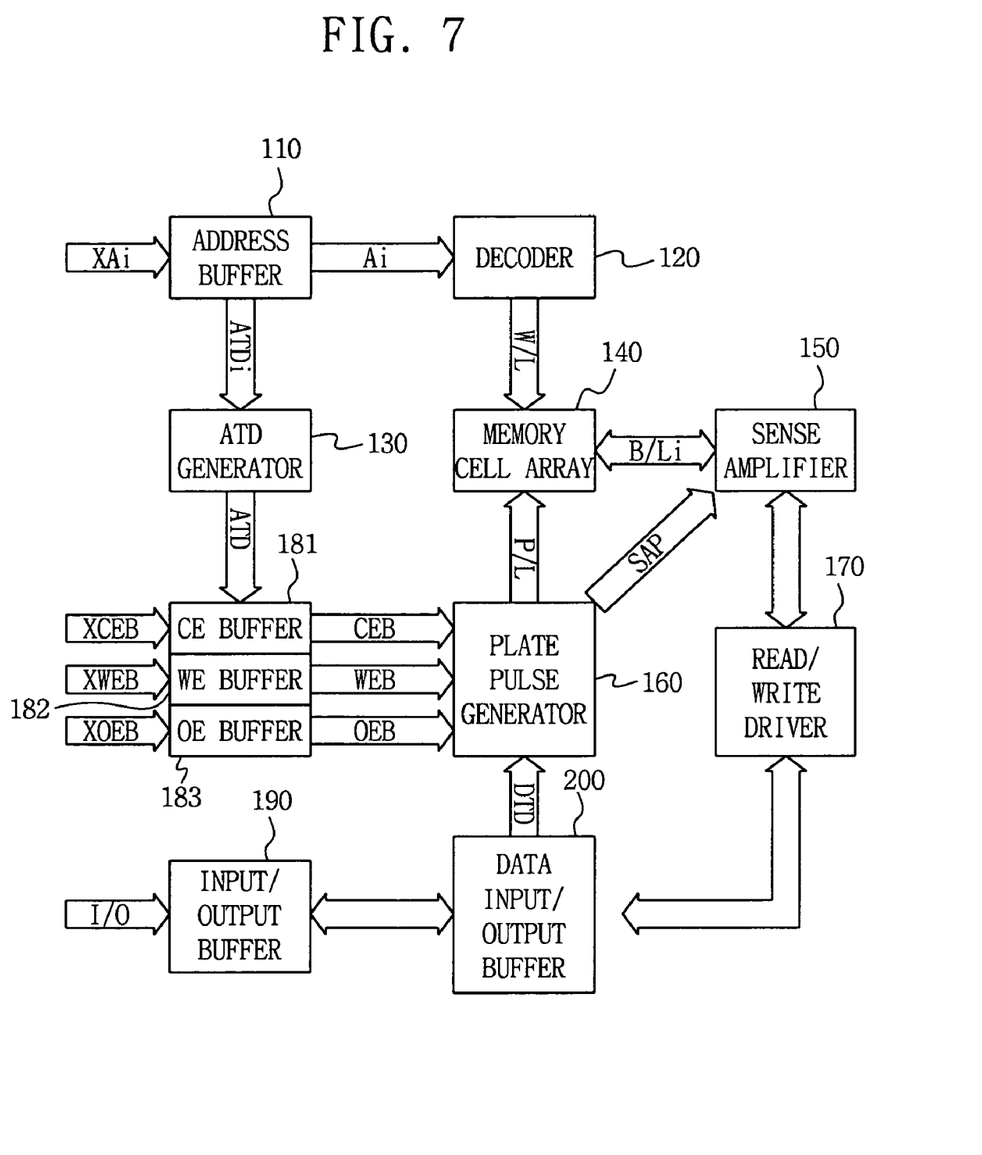
FIG. 7 is a block diagram illustrating a ferroelectric RAM device according to an exemplary embodiment of the present invention.

FIG. 7 is a block diagram of a ferroelectric Random Access Memory (RAM) device according to an exemplary embodiment of the present invention. The ferroelectric RAM device includes an address buffer 110, an address transition detection signal generator 130, a memory cell array 140, a plate pulse generator 160, a decoder circuit 120, a sense amplifier 150, a read/write driver 170, a data input/output buffer circuit 200, an external chip enable buffer circuit (CE buffer) 181, a write enable buffer circuit (WE buffer) 182 and an output enable buffer circuit (OE buffer) 183 etc.

The address buffer 110 receives an applied external address signal XAi, and transfers an address signal Ai to the decoder 120. It also detects an address transition and generates ATDi signals corresponding to that the address transition.

The address transition signal generator 130 detects the address transition, adds up the ATDi signals, and generates an address transition detection signal ATD.

The memory cell array 140 is configured in such a way that memory cells are each connected with a plate line, a word line and a bit line, at rows and columns. The memory cells are each constructed of one ferroelectric capacitor and one access transistor and store data. The plate pulse generator 160 receives an address transition detection signal ATD, a write enable signal WEB and a data transition detection signal DTD applied from a data input buffer 200. It independently generates a pulse, corresponding to the input, that enables or disables a plate line. The decoder circuit 120 decodes an address signal Ai applied from the address buffer circuit 110, and generates a word line enable signal W/L selecting a specific memory cell corresponding to the address signal. The sense amplifier 150 is operated by a sense amplifier enable signal SAP, generated after a plate line P/L is enabled first. It both senses and amplifies data inputted from the outside, and excites it to a bit line B/Li. The read/write driver 170 amplifies read data, when reading, and sends it to an output buffer. When writing it transfers data inputted, in response to the generation of a write enable signal WEB, to the sense amplifier 150. The data input/output buffer circuit 200 performs a data input/output with a sense amplifier, and a data input buffer circuit thereof senses a transition of data inputted through an input/output buffer circuit 190 from the outside. It also generates a data transition detection signal DTD and applies it to the plate pulse generator 160. The external chip enable buffer circuit (CE buffer) 181, the write enable buffer circuit (WE buffer) 182 and the output enable buffer circuit (OE buffer) 183 transfer an external chip enable signal XCEB, a write enable signal XWEB and an output enable signal XOEB, respectively inputted from the outside, to the plate pulse generator 160. It also transfers an internal chip enable signal corresponding to an applied address transition detection signal ATD or the address transition detection signal ATD itself to the plate pulse generator 160.

Figure 8:
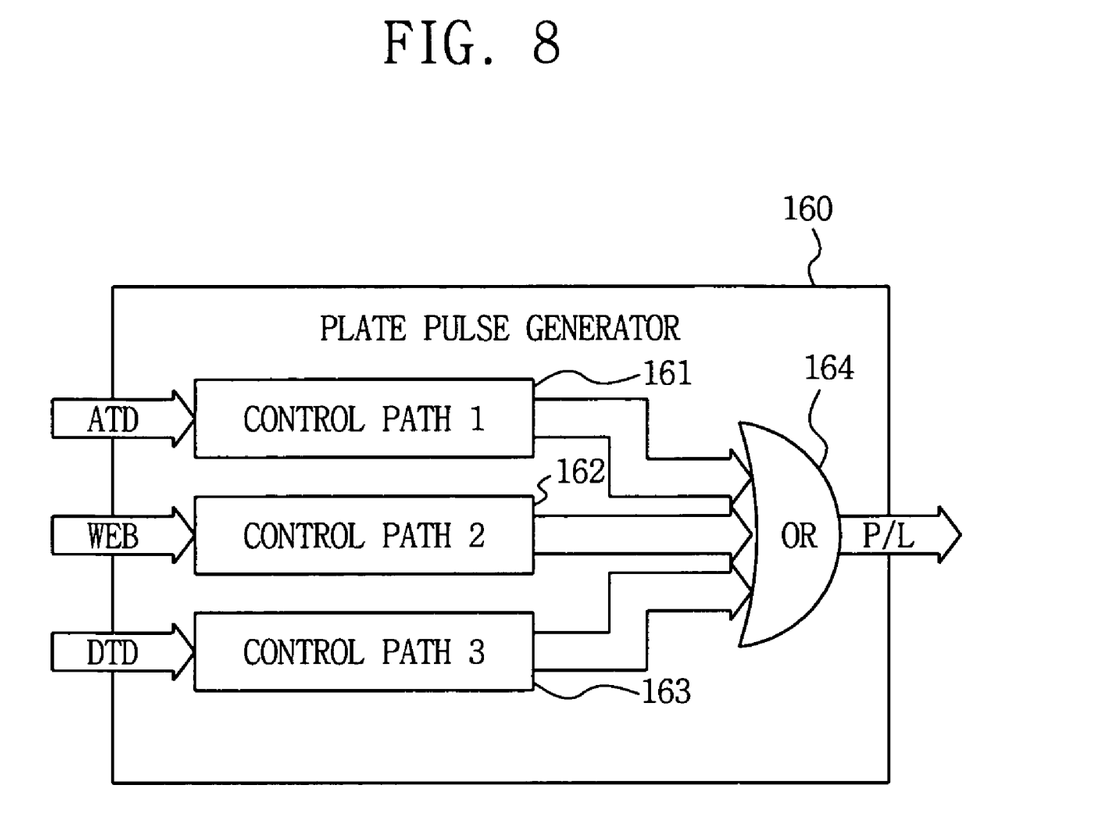
FIG. 8 is a block diagram of a plate pulse generator in accordance with the present invention.

FIG. 8 is an internal block diagram of an exemplary embodiment of a plate pulse generator 160, in accordance with the present invention, constituting a ferroelectric RAM device as depicted in FIG. 7. The plate pulse generator 160 is configured so that each plate line enable signal is applied to a plate line through a logic OR gate 164 in response to a write enable signal WEB and a data transition detection signal DTD, where the plate line enable signal is generated through control paths 161, 162 and 163. Thus, the plate line enable signals generated in the plate pulse generator 160 are generated individually and independently. They are not affected by an already generated plate enable signal or a later generated plate enable signal, and are each applied to a plate line P/L. The plate line enable signals may also be generated simultaneously. Further, a plate line enable signal generated in response to a write enable signal WEB and data transition detection signal DTD can have a pulse type where an enable state is maintained for a time long enough to store data. An enable section of the pulse may be about 10 to 15 ns.

In particular, a plate enable signal applied to a plate line in response to the data transition detection signal DTD has a single pulse type to enable a plate line connected to a memory cell and then to disable it after a given time lapse. Then a write operation is executed. That is, at an enabled section of the plate line, data '0' as a first logic data among applied data is stored, and at a disabled section of the plate line P/L, data '1' as second logic data opposite to the first logic data is stored. A pulse generated by the data transition detection signal DTD is controlled and generated after a first enabled time of the plate line, which is enabled by a plate line enable signal that is generated in response to the address transition detection signal ATD or write enable signal WEB.

FIGS. 9 to 13 are exemplary timing diagrams illustrating operation examples of a ferroelectric RAM device according to exemplary embodiments of the present invention.

Figure 9:
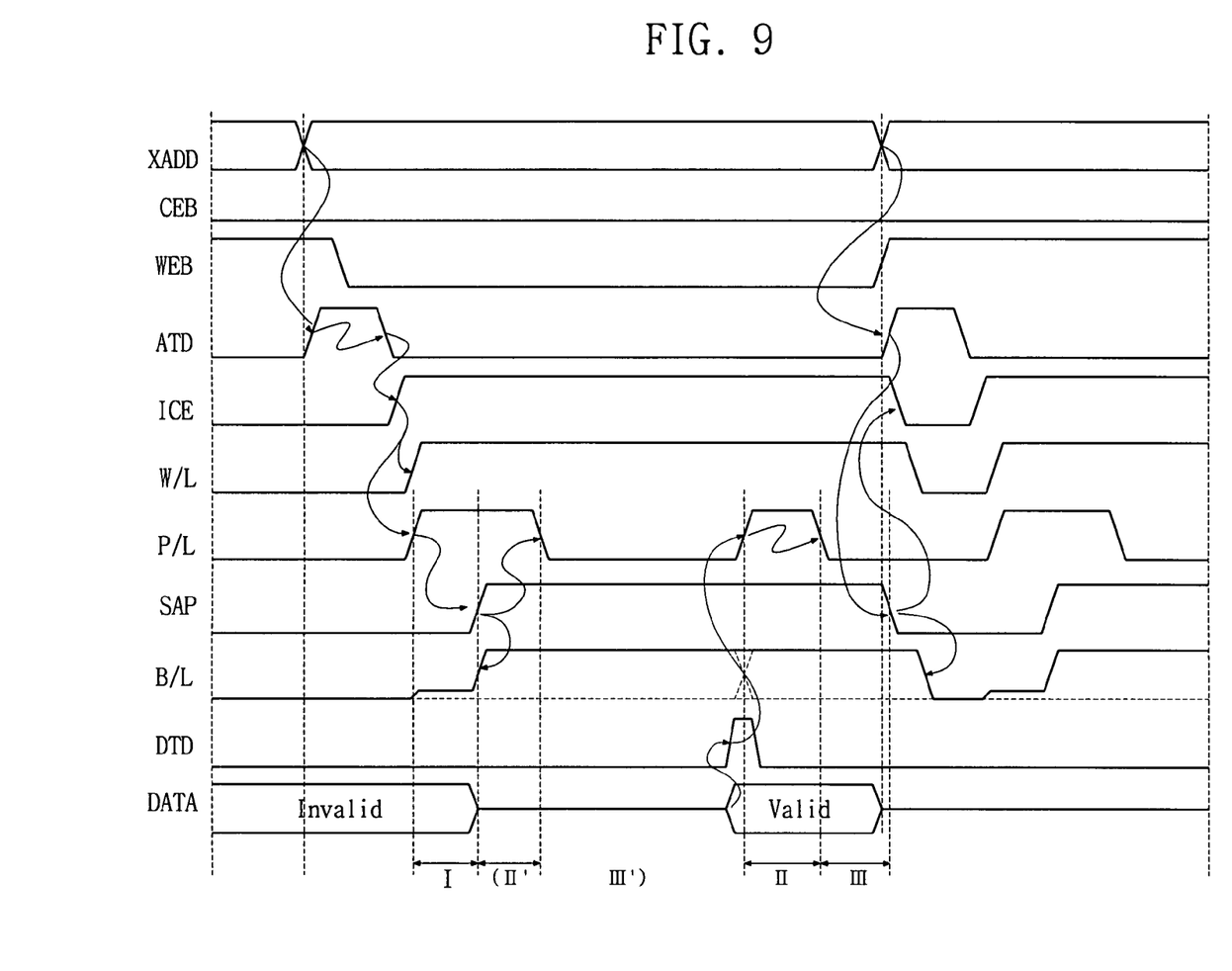
FIG. 9 is a timing diagram depicting operation of an exemplary embodiment of the present invention.

FIG. 9 illustrates an exemplary embodiment, in accordance with the present invention, of a write operation for a case that a write enable signal WEB is previously enabled, a plate line P/L enabled by an address transition detection signal ATD is disabled and then data is inputted. An external chip enable signal CEB is maintained as an enable state in a low level, and in this state, an address signal XADD is applied from the outside. A transition of the address signal XADD is sensed and an address transition detection signal ATD is generated. An internal chip enable signal ICE is generated by the address transition detection signal ATD. When the internal chip enable signal ICE is generated, a word line W/L is enabled by a word line decoder and driver circuit. Also, a plate line P/L is enabled in response to the internal chip enable signal ICE or the address transition detection signal ATD.

When the plate line P/L is enabled, a read section I starts on operation. A voltage corresponding to data stored in a memory cell is excited to a bit line B/L maintaining a ground voltage state. Next, when the time corresponding to the read section I lapses after an enable signal of the plate line P/L is generated. A sense amplifier enable signal SAP is generated and enables a sense amplifier. When the sense amplifier is enabled, the operation of the read section I is completed, and the sense amplifier senses and amplifies data excited to the bit line B/L.

When the sense amplifier is enabled, the plate line P/L is disabled in response. The time interval between the enabling of the sense amplifier and the disabling of the plate line P/L is, after the generation of a write enable signal WEB, the write section II' of optional data '0'. When data '0' is inputted from the outside during this section II', the data '0' is stored at a memory cell. The section from the disabling of the plate line P/L to an input of data from the outside is the write section III' of optional data '1', and when data '1' is inputted from the outside, the data '1' is stored. In the case that desired data from the outside is not inputted during the optional data write sections II' and III' undesired optional data is stored, or a data initially stored at the memory cell is maintained.

When the data signal DATA is inputted from the outside after the plate line P/L is disabled, a transition of the data is detected and a data transition detection signal DTD is generated. Also a single pulse for enabling the plate line only for a given time is generated in response to the data transition detections signal DTD, and the plate line P/L is enabled by the pulse. The time interval beginning from the enabling of the plate line P/L to the disabling of the plate line P/L is the write section II of data '0' among the inputted data. Data signal DATA inputted from the outside is amplified in a sense amplifier and is excited to a bit line B/L. If the data excited to the bit line B/L is '0', the voltage of the bit line B/L maintains a ground voltage state. Thus, data '0' is written by the voltage difference between the bit line B/L and the enabled plate line P/L. Meanwhile, if the data excited to the bit line B/L is '1', the voltage of the bit line B/L maintains a power source voltage state. Hence, there is no a voltage difference due to the enabled plate line P/L and so any no operation occurs.

When the plate line P/L is enabled during the write section II of the data '0' and then is again disabled by the pulse, the write section III of data '1' starts on operation. At the write section of data '1', a voltage of bit line B/L has a power source voltage level by a voltage corresponding to data '1' excited to a bit line B/L, and the plate line P/L maintains a disabled sate, thus data '1' is stored at a memory cell by the voltage difference between the bit line B/L and the plate line P/L. The write section of the data '1' is completed when the sense amplifier is disabled by an address transition detection signal ATD as the transition of the address signal XADD of the next cycle is sensed.

As described above, when the write operation of data is completed, the bit line B/L is precharged and the internal chip enable signal ICE is disabled.

According to the exemplary embodiment depicted in FIG. 9, a sufficient write time can be ensured by generating a plate enable signal through use of a data transition detection signal DTD, thereby obtaining a stabilized write operation. The write operation is completed in one cycle time contrary to conventional techniques.

Figure 10:
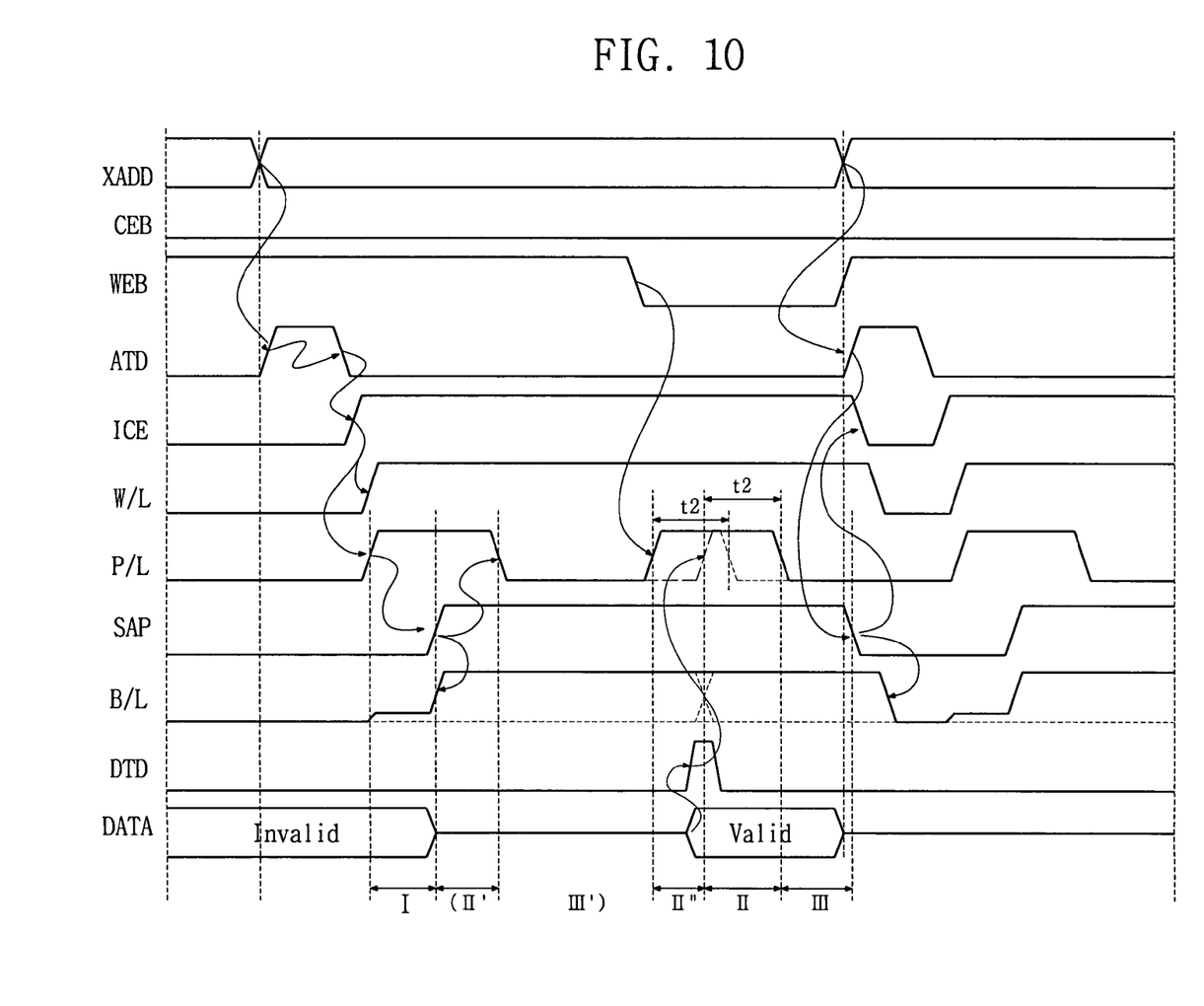
FIG. 10 is a timing diagram depicting operation of an exemplary embodiment of the present invention.

FIG. 10 is a timing diagram illustrating an exemplary embodiment, in accordance with the present invention, of a write operation in the case where a plate line P/L is enabled by an address transition detection signal ATD and is subsequently disabled after the lapse of a given time, after which a write enable signal WEB is applied immediately before the external data is inputted. The operation of the read section I is equivalent to the description of FIG. 9. Since a write enable signal WEB is not applied at sections II' and III', which occur immediately after read section I and immediately before the generation of the write enable signal WEB, a write-back or restoring operation is executed. The write-back or restoring operation restores the polarization generated by the read operation of the read section I to an originally stored data. The write-back or restoring operation, sections II' and III', is completed in when the write enable signal WEB is applied.

When the write enable signal WEB is applied, a plate line P/L is again enabled and is maintained as the enable state for a given time t2. Here, after the write enable signal WEB is applied and before data signal DATA is inputted, there may exist a write section II" of optional data '0', which is capable of storing optional data '0' existing on a data line.

The plate line P/L is maintained is the enable state, and in this state, write data signal DATA from the outside is inputted. A transition of the data signal DATA is detected and a data transition detection signal DTD is generated. A single pulse is generated to enable the plate line only for a given time t2 in response to the data transition detection signal DTD, and the plate line P/L is enabled by the pulse. The subsequent operations are similar to the description of FIG. 9.

The plate line P/L is enabled by the write enable signal WEB, and then, before the plate line P/L is disabled after a lapse of given time t2, the plate line P/L is again maintained in the enable state for a given time t2 by an enable signal of the plate line generated in response to the data transition detection signal DTD. Thus, the write section II of actual data '0' becomes a section that is from the time when the plate line P/L is enabled by the data transition detection signal DTD to the time when the plate line P/L is disabled after given time t2. The write section III of data '1' lasts for a time interval that ranges from the time when the plate line P/L is disabled to the time when a sense amplifier is disabled by an address transition detection signal ATD of the next cycle that is generated by a transition of the address signal XADD of the next cycle.

According to the exemplary embodiment depicted in FIG. 10 described above, in the case data is inputted from the outside after the plate line P/L is enabled by a write enable signal WEB, but before the plate line P/L is disabled again; the plate line P/L is enabled by a plate enable signal responding to the data transition detection signal DTD. Thus a sufficient write time can be ensured, obtaining a stabilized write operation. The write operation is completed in one cycle time.

Figure 11:
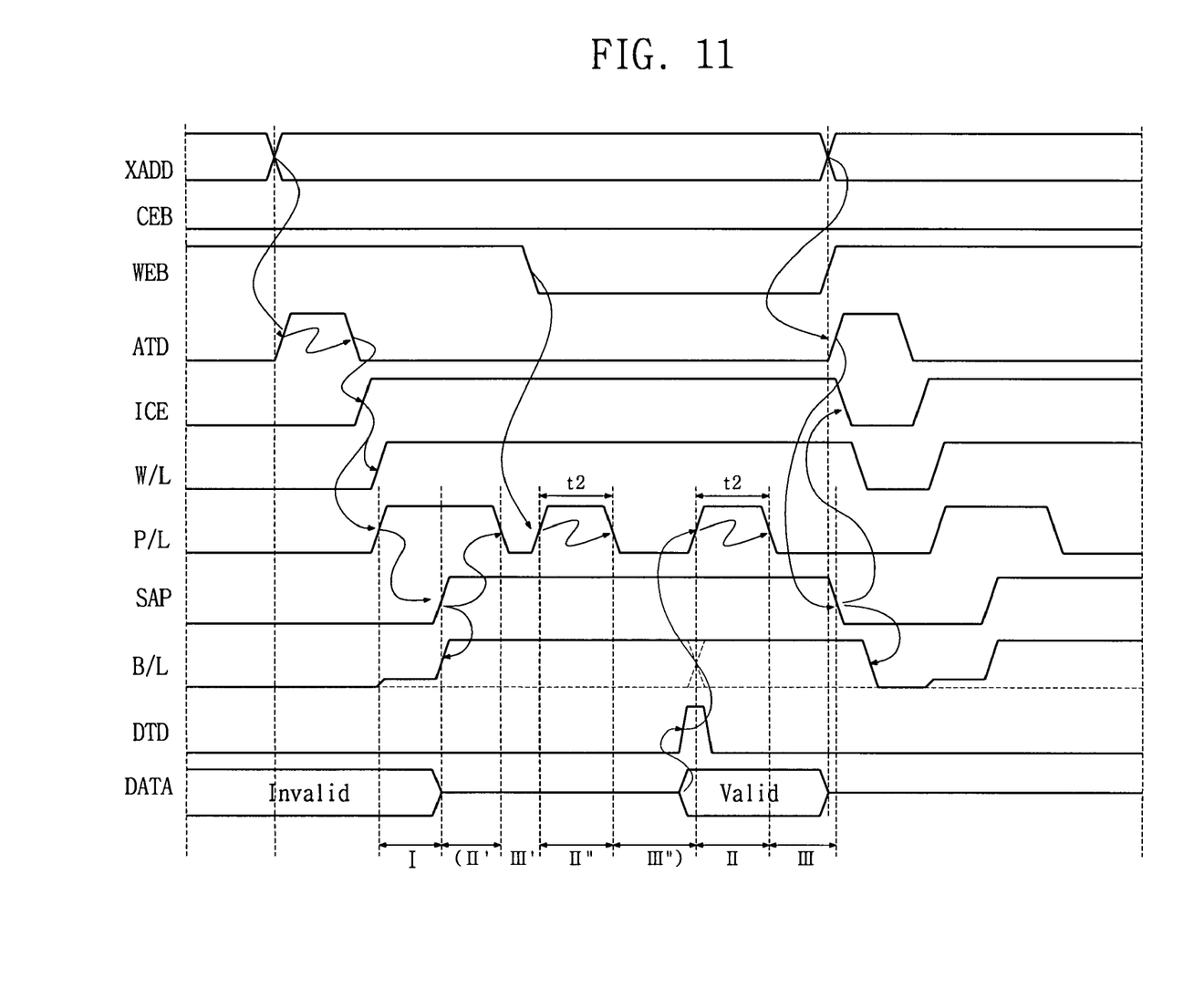
FIG. 11 is a timing diagram depicting operation of an exemplary embodiment of the present invention.

FIG. 11 is a timing diagram for an exemplary embodiment, in accordance with the present invention, of a write operation in the case where the plate line P/L enabled by an address transition detection signal ATD and is disabled after the lapse of a given time; then the plate line P/L is enabled by a write enable signal WEB applied later and is then again disabled after lapse of given time t2, and then the external data is inputted.

As shown in FIG. 11, the write enable signal WEB is applied and operations to an enabling of the plate line are equivalent to the description of FIG. 10. The plate line P/L enabled by the applied write enable signal WEB and is again disabled after lapse of given time t2. When data signal DATA is inputted from the outside after the disabling of the plate line P/L, a transition of the data is detected and a data transition detection signal DTD is generated. A plate enable signal is generated in response to the data transition detection signal DTD, and this enables the plate line P/L for a given time t2. Subsequent operations are equivalent to the description of FIG. 10.

The interval, which ranges from the time when a plate line P/L is enabled by the write enable signal WEB to the time when the plate line P/L is again disabled and is then enabled in response to a data transition detection signal DTD, contains optional data write sections II" and III" that are capable of writing undesired data. The section, which ranges from the enabling time of the plate line P/L that is enabled in response to the data transition detection signal DTD to the time it is disabled after a given time t2, becomes the write section II of actual data '0'. The interval, which ranges from the disabling time of the plate line P/L after the write section II of the actual data '0' to the disabling time of a sense amplifier that has been disabled by the address transition detection signal ATD of the next cycle generated by a transition of the address signal XADD of, becomes a write section III of actual data '1'.

According to the exemplary embodiment depicted in FIG. 11, described above, the plate line P/L is enabled by the write enable signal WEB, and is then disabled again; then data is inputted from the outside. Here, a sufficient write time can be ensured by a plate enable signal responding to the data transition detection signal DTD, obtaining a stabilized write operation.

Figure 12:
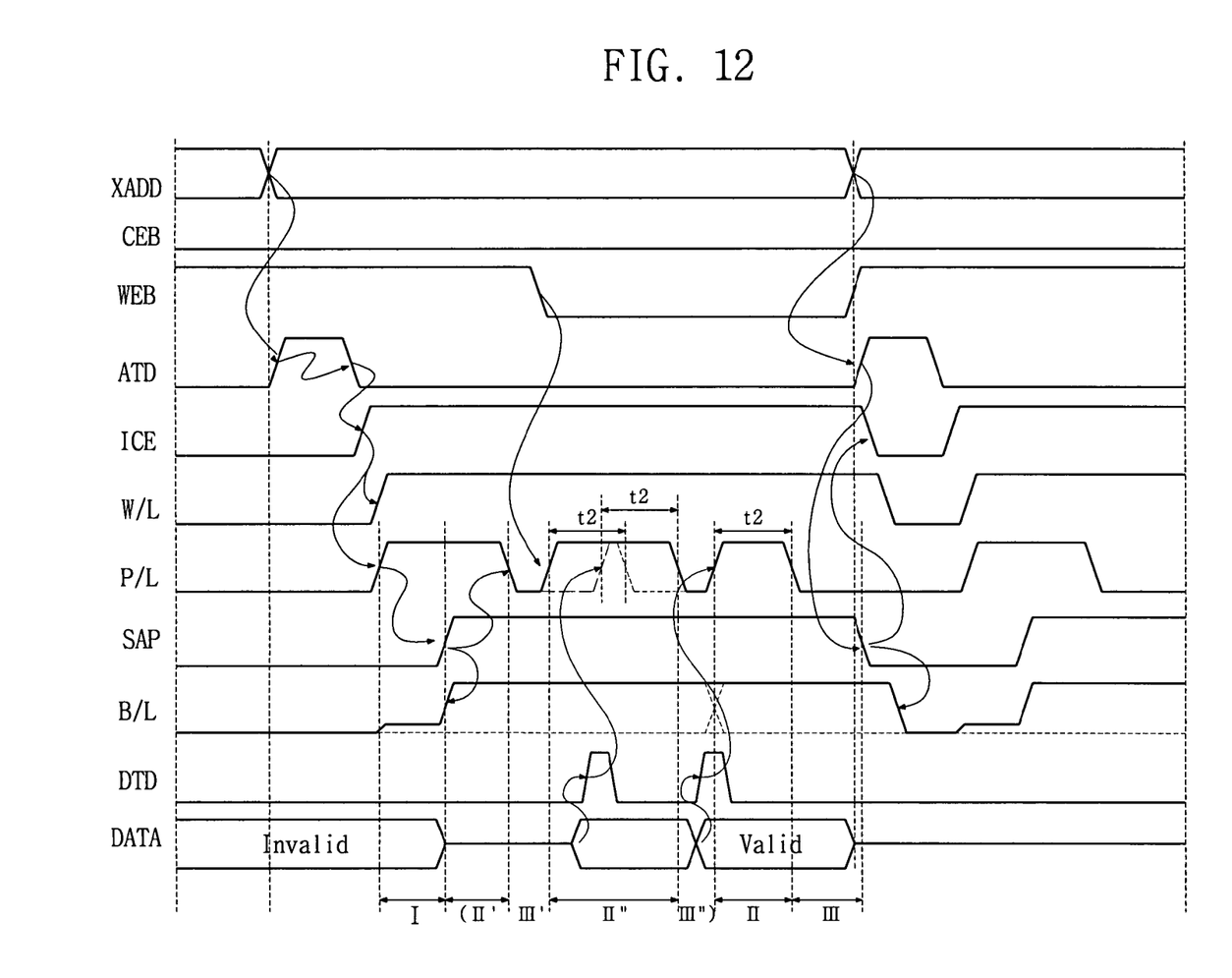
FIG. 12 is a timing diagram for depicting operation of an exemplary embodiment of the present invention.

FIG. 12 is a timing diagram for an exemplary embodiment, in accordance with the present invention, of write operations in the case where there is a change of input data. In this case noise, or another fault, occurs and undesired optional data is inputted following which the desired data is inputted. Operations before the write enable signal WEB is applied, are equivalent to the description of FIG. 11.

When the write enable signal WEB is applied, the plate line P/L is again enabled and is maintained in the enabled state for a given time t2. While the enabled state of the plate line P/L is maintained, undesired data is inputted because of noise or faults from the outside. Even when such undesired data is inputted, a transition of the data is detected, a first data transition detection signal DTDs generated and a single pulse for enabling the plate line P/L, only for a given time t2, is generated as well. Thus, the plate line is enabled by the write enable signal WEB, and then, before the plate line is disabled, after a lapse of given time t2, the plate line P/L is again enabled for another given time t2 by the enable signal of the plate line that is generated in response to the first data transition detections signal DTD.

Hence, sections II" and III" are where undesired data due to noise, etc. are written and the actually desired write data are inputted; this is continued to a time when a second data transition signal is generated. Here, the part of section II", ranging from the enabling time of the plate line P/L that is enabled by the write enable signal WEB to the again enabled time of the plate line P/L by the first data transition detection signal DTD, is a section capable of writing optional data '0' that exists on the data line. The part of section II", between the plate line is again enabled by the first data transition detection signal DTD, wherein the enabled state is maintained continuously and the plate line P/L being disabled after a given time t2, becomes the write section of optional data '0' through noise, etc. in the data line. The write section III" of undesired optional data '1' ranges from the time interval beginning with the disabling time of the plate line P/L to an enabling time of the plate line P/L that is due to a second data transition detection signal DTD.

When the plate line P/L is enabled and is again disabled by an input of undesired data, and then undesired data signal DATA is again inputted from the outside, a transition of the data is detected, generating a second data transition detection signal DTD. A plate enable signal is generated in response to the second data transition detection signal DTD, hence the plate line P/L maintains an enabling state for a given time t2. Subsequent operations are equivalent to the description of FIG. 11.

The time interval, ranging from the again enabled time of the plate line P/L responding to the second data transition detection signal DTD to a disabling time of the plate line P/L after a given time t2, becomes a write interval II of actual data '0'. The time interval, ranging from the disabling time of the plate line P/L after the write interval of the data '0' to a disabling time of a sense amplifier disabled by an address transition detection signal ATD of the next cycle generated by a transition of an address signal XADD of the next cycle, becomes a write section III of actual data '1'.

Figure 13:
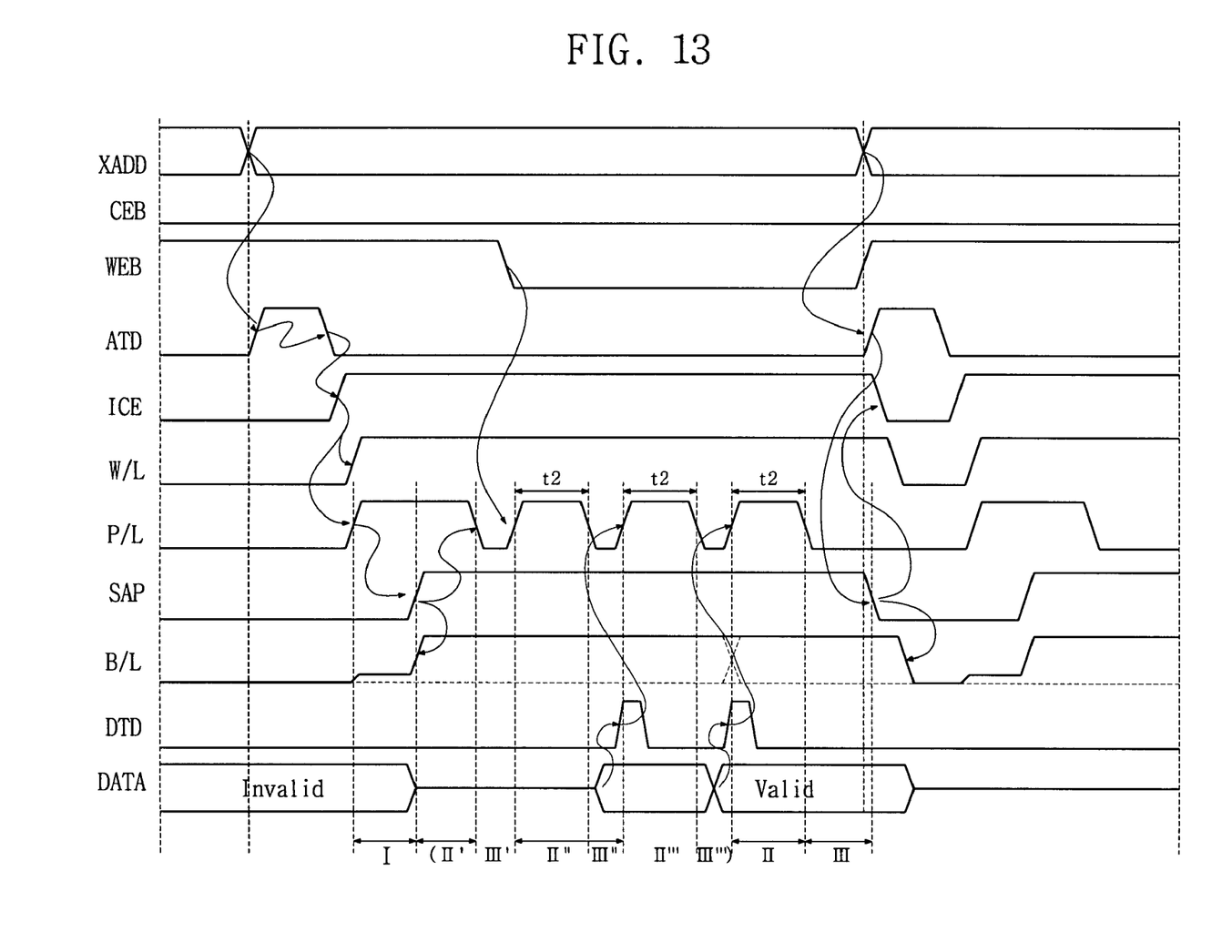
FIG. 13 is a timing diagram depicting operation of an exemplary embodiment of the present invention.

FIG. 13 is a timing diagram for an exemplary embodiment, in accordance with the present invention, of a write operation in a case where there is a change in input data, like that of FIG. 12. The write operation is similar to the operations of FIG. 12; operations before a write enable signal WEB is applied, are equivalent to the description of FIG. 12. When the write enable signal WEB is applied, a plate line P/L is again enabled and its enabled state is maintained for a given time t2. The plate line P/L is disabled after a given time t2 and then undesired data from noise or fault is inputted from the outside.

Even if such undesired data is inputted, a transition of the data is detected, generating a first data transition detection signal DTD and generating a single pulse that enables the plate line P/L only for a given time t2 in response to the first data transition detection signal DTD. Thus, the plate line P/L also maintains an enabled state for a given time t2 by an enable signal of the plate line generated in response to the first data transition detection signal DTD.

When the plate line P/L is enabled by an input of the undesired data, after which it is again disabled and then a desired data signal DATA is inputted, a transition of the data is detected, generating a second data transition detection signal DTD. A plate enable signal is generated in response to the second data transition detection signal DTD, and the plate line P/L maintains an enabled state for a given time t2. Subsequent operations are equivalent to the description of FIG. 12.

Intervals II" and III", ranging from the enabled time of the plate line P/L responding to the write enable signal WEB to the enabling time of the plate line P/L that is enabled in response to the first data transition detection signal DTD, is a write section of undesired data existing on a data line. Further, sections II'" and III'", in which the plate line P/L is enabled by the first data transition detection signal DTD, after which actually desired write data is inputted and a second data transition detection signal is generated thus the plate line P/L is enabled again, are optional data write sections II'" and III'" through noise etc. inputted from the outside.

The time interval, between the enabling time of the plate line P/L that is again enabled in response to the second data transition detection signal DTD to a disabling time of the plate line P/L after a given time t2, becomes a write section II of actual data '0'. The time interval, starting with the disabling time of the plate line P/L after the write section of the data '0' to a disabling time of the sense amplifier disabled by an address transition detection signal ATD of the next cycle that is generated by a transition of an address signal XADD of the next cycle, becomes a write section III of actual data '1'.

According to the exemplary embodiments depicted in FIGS. 12 and 13, in case there is a change in input data, a data transition detection signal DTD is generated at every transition of changed data, and the plate line P/L is enabled for a given time t2 by the generated data transition detection signals DTD, thereby obtaining a stabilized write operation even for a data change caused by noise or fault.

According to exemplary embodiments of the present invention, it was described above, that data '0' corresponded to a state point B of the hysteresis loop shown in FIG. 1, and a state point D corresponded to data '1'. In the case a plate line was enabled and a bit line voltage was a ground voltage, data '0' was written and the plate line was disabled. In the case a bit line voltage was a power source voltage, data '1' was written. But, those of ordinary skill in the art know that a state point B may correspond to data '1' and a state point D may correspond to data '0'. Furthermore, it goes without saying that a level of plate line and bit line may be varied diversely in a write operation.

According to exemplary embodiments of the present invention, a transition of input data is sensed, generating a data transition detection signal, and in response to this signal a pulse is generated. A plate line is independently enabled by the pulse and is disabled after a given time. Whereby, a write cycle time can be reduced, as compared with a disable system of the plate line using an address transition detection signal of a next cycle of a conventional technique, and a stabilized write operation can be obtained. Furthermore, contrary to a conventional technique, operations of data '0' and '1' are completed within one cycle time. Also, read operation and write operation can have the same cycle time. Accordingly, a control system of ferroelectric RAM device can be simplified.

While the present invention has been particularly shown and described with reference to exemplary embodiments thereof, it will be understood by those skilled in the art that various changes in form and details may be made therein without departing from the spirit and scope of the present invention as defined by the appended claims. For example, an internal construction of the circuit may be varied or internal configurative elements of the circuit may be replaced with other equivalent elements. Accordingly, these and other changes and modifications are seen to be within the true spirit and scope of the invention as defined by the appended claims.

What is claimed is:

1. A ferroelectric Random Access Memory ("RAM") device that performs a write operation of storing data in a ferroelectric memory cell constructed of a ferroelectric capacitor and an access transistor, the device comprising:
   a data input buffer circuit for sensing a transition of input data and generating a data transition detection signal; and
   a plate pulse generator for generating a pulse that enables a plate line connected to the memory cell in response to the data transition detection signal and then disables it after lapse of a given time, wherein a first logic data, among applied data, is stored at an enabled section of the plate line, and a second logic data, opposite to the first logic data, is stored at a disabled section of the plate line.

2. The device of claim 1, wherein the plate pulse generator comprises a circuit for sensing a transition of inputted address signals and generating a plate line enable signal in response to an address transition detection signal outputted from an address transition detection signal generator.

3. The device of claim 1, wherein the plate pulse generator further comprises circuit for enabling the plate line in response to a write enable signal and then for disabling it after a given time lapses.

4. The device of claim 2, wherein the pulse generated by the data transition detection signal is generated, after a first enablement of the plate line, by the plate line enable signal generated in response to the address transition detection signal after an address signal is generated.

5. The device of claim 4, wherein the pulse generated by the data transition detection signal on the plate line is generated independently, regardless of whether the plate line has an enabled state or a disabled state.

6. The device of claim 5, wherein the enable section of the plate line corresponds to time enough to store data in the memory cell.

7. The device of claim 6, wherein the first logic data is data '0' and the second logic data is data '1'.

8. The device of claim 7, wherein the first logic data is data '1' and the second logic data is data '0'.

9. A control method of ferroelectric RAM device for performing a write operation of storing data in a ferroelectric memory cell that is constructed of a ferroelectric capacitor and an access transistor, the method comprising:
   sensing a transition of data after an address signal is applied, and generating a data transition detection signal;
   generating a plate line enable signal in response to the data transition detection signal and enabling the plate line connected to the memory cell;
   storing a first logic data among input data in the memory cell, at an enabled section of the plate line;
   disabling the plate line; and
   storing second a logic data opposite to the first logic data among input data, in the memory cell, at a disabled section of the plate line.

10. The method of claim 9, further comprising generating an enable signal on the plate line in response to an address transition detection signal that is outputted by sensing a transition of the address signal, before the plate line is enabled in response to the data transition detection signal.

11. The method of claim 9, further comprising generating an enable signal on the plate line in response to a write enable signal, before the plate line is enabled in response to the data transition detection signal.

12. The method of claim 9, wherein the plate line enable signal responding to the data transition detection signal is generated, before the plate line is enabled in response to a write enable signal and is then disabled.

13. The method of claim 9, wherein the plate line enable signal generated on the plate line by the data transition detection signal is generated independently, regardless of whether the plate line is enabled or disabled.

14. The method of claim 13, wherein the enable section of the plate line corresponds to time enough to store data in the memory cell.

15. The method of claim 14, wherein the first logic data is data '0' and the second logic data is data '1'.

16. The method of claim 15, wherein the first logic data is data '1' and the second logic data is data '0'.

17. The device of claim 3, wherein the pulse generated by the data transition detection signal is generated, after a first enablement of the plate line, by the plate line enable signal generated in response write enable signal after an address signal is generated.

18. The device of claim 17, wherein the pulse generated by the data transition detection signal on the plate line is generated independently, regardless of whether the plate line has an enabled state or a disable state.

19. The device of claim 18, wherein the enable section of the plate line corresponds to time enough to store data in the memory cell.

20. The device of claim 19, wherein the first logic data is data '0' and the second logic data is data '1'.

21. The device of claim 20, wherein the first logic data is data '1' and the second logic data is data '0'.

* * * * *